(12) United States Patent
Lee

(10) Patent No.: US 6,746,936 B1
(45) Date of Patent: Jun. 8, 2004

(54) METHOD FOR FORMING ISOLATION FILM FOR SEMICONDUCTOR DEVICES

(75) Inventor: Joon Hyeon Lee, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/622,351

(22) Filed: Jul. 18, 2003

(30) Foreign Application Priority Data

Dec. 9, 2002 (KR) .................. 10-2002-0077969

(51) Int. Cl.$^7$ ............... H01L 21/8238; H01L 21/8242; H01L 21/336; H01L 21/331; H01L 21/76
(52) U.S. Cl. ............... 438/445; 438/221; 438/246; 438/248; 438/296; 438/359; 438/424; 438/433; 438/440; 438/438; 438/444; 438/449; 438/524; 438/526; 438/529; 438/700; 438/701
(58) Field of Search ............... 438/221, 246, 248, 296, 359, 424, 433, 440, 444, 445, 449, 524, 526, 529, 700, 701

(56) References Cited

U.S. PATENT DOCUMENTS

| | | | |
|---|---|---|---|
| 5,801,083 A | * 9/1998 | Yu et al. | 438/424 |
| 5,904,538 A | * 5/1999 | Son et al. | 438/424 |
| 6,001,707 A | * 12/1999 | Lin et al. | 438/433 |
| 6,099,647 A | 8/2000 | Yieh et al. | |
| 6,165,870 A | * 12/2000 | Shim et al. | 438/424 |
| 6,228,727 B1 | * 5/2001 | Lim et al. | 438/296 |
| 6,265,282 B1 | 7/2001 | Lane et al. | |
| 6,274,500 B1 | * 8/2001 | Xuechun et al. | 438/706 |
| 6,414,364 B2 | 7/2002 | Lane et al. | |
| 6,437,417 B1 | * 8/2002 | Gilton | 257/506 |
| 6,495,424 B2 | * 12/2002 | Kunikiyo | 438/296 |
| 6,562,696 B1 | * 5/2003 | Hsu et al. | 438/424 |
| 6,569,750 B2 | * 5/2003 | Kim et al. | 438/524 |
| 2003/0045079 A1 | * 3/2003 | Han | 438/585 |

FOREIGN PATENT DOCUMENTS

| | | |
|---|---|---|
| JP | 2001 23120 | 1/2001 |
| JP | 2001 44193 | 2/2001 |

* cited by examiner

*Primary Examiner*—John F. Niebling
*Assistant Examiner*—Stanetta Isaac
(74) *Attorney, Agent, or Firm*—Ladas & Parry

(57) ABSTRACT

The present invention relates to a method for forming an isolation film for semiconductor devices. This method comprises the steps of: successively forming a first oxide film and a nitride film on a semiconductor substrate; patterning the nitride film and the first oxide film to expose a portion of the semiconductor substrate, which corresponds to an isolation region; implanting impurity ions into the exposed portion of the semiconductor substrate to form an impurity ion-implanted layer; forming a spacer at the sidewall of the patterned nitride film, and at the same time, etching the ion-implanted layer using the spacer as a mask; etching a portion of the semiconductor substrate exposed by the etching of the ion-implanted layer, using the spacer as a mask, thereby forming a trench; removing the spacer; annealing the trench so that the corner of the trench is rounded; forming a second oxide film along the inner wall of the trench; depositing a polarizing oxide film on the entire surface of the resulting substrate in such a manner as to gap fill the trench; subjecting the polarizing oxide film to chemical mechanical polishing (CMP) using the nitride film as a polishing stopper film, thereby polarizing the polarizing oxide film; and removing the nitride and first nitride films remaining after the polarizing step.

16 Claims, 6 Drawing Sheets

US 6,746,936 B1

METHOD FOR FORMING ISOLATION FILM FOR SEMICONDUCTOR DEVICES

BACKGROUND OF THE INVENTION

1. Field of the Invention

The present invention relates to a method for forming an isolation film for semiconductor devices, and more particularly, to a method for forming an isolation film for semiconductor devices, which prevents the formation of an edge moat.

2. Description of the Prior Art

With the advancement of semiconductor technology, the high speed and high integration level of semiconductor devices are rapidly increased, and at the same time, requirements for a fine pattern are gradually increased. These requirements are also applied to an isolation region, which occupies a relatively large area in a semiconductor substrate.

Currently, as an isolation film providing the isolation between semiconductor devices, there is generally used a LOCOS oxide film. This LOCOS isolation film is formed by local oxidation of silicon (LOCOS).

However, the LOCOS isolation film is disadvantageous in that a bird's beak is formed at the edge of the isolation film such that the area of the isolation film is increased and leakage current is induced.

Thus, in an attempt to solve the problem occurring in the LOCOS isolation film, there was proposed a method wherein an isolation film having reduced width and excellent isolation characteristics is formed using shallow trench isolation (STI).

FIG. 1 is a cross-sectional view illustrating a method for forming an isolation film for semiconductor devices according to a general STI technology. As shown in FIG. 1, a pad oxide film and a pad nitride film are formed on a semiconductor substrate and patterned to expose a portion of the substrate, which corresponds to a field region. Then, the exposed portion of the substrate is etched to a given depth to form a trench 17. Next, the resulting substrate is subjected to sacrificial sidewall oxidation and liner oxidation, after which a high-density plasma oxide film as a field oxide film is formed on the substrate in such a manner as to fill the trench. Thereafter, the resulting substrate is subjected to chemical mechanical polishing (CMP) to complete the formation of a field oxide film 20 filling the trench, and then the pad nitride film is removed.

Then, the surface of the substrate is cleaned with a cleaning solution containing HF, HF/H$_2$O, buffer oxide etchant (BOE) or the like, before deposition of a gate oxide film.

In other words, since the deposition of the gate oxide film is very critical to the characteristics of semiconductor transistors, the remaining foreign substances are removed with HF or a mixture of HF and other substances, before deposition of the gate oxide film.

However, during this cleaning process, an edge moat can be formed. If this edge moat occurs, sub-threshold current (Hump) and inverse narrow width effect (INWE) will occur to cause the abnormal operation of semiconductor devices.

SUMMARY OF THE INVENTION

Accordingly, the present invention has been made to solve the above-mentioned problems occurring in the prior art, and an object of the present invention is to provide a method for forming an isolation film for semiconductor devices, which can maximize the corner rounding of a trench and improve device characteristics, such as Hump and INWE.

To achieve the above object, the present invention provides a method for forming an isolation film for semiconductor devices, which comprises the steps of: successively forming a first oxide film and a nitride film on a semiconductor substrate; patterning the nitride film and the first oxide film to expose a portion of the semiconductor substrate, which corresponds to an isolation region; implanting impurity ions into the exposed portion of the semiconductor substrate to form an impurity ion-implanted layer; forming a spacer at the sidewall of the patterned nitride film, and at the same time, etching the ion-implanted layer using the spacer as a mask; etching a portion of the semiconductor substrate exposed by the etching of the ion-implanted layer, using the spacer as a mask, thereby forming a trench; removing the spacer; annealing the trench; forming a second oxide film at the inner wall of the trench; depositing a polarizing oxide film on the entire surface of the resulting substrate in such a manner as to gap fill the trench; subjecting the polarizing oxide film to chemical mechanical polishing (CMP) using the nitride film as a polishing stopper film, thereby polarizing the polarizing oxide film; and removing the nitride and first nitride films remaining after the polarizing step.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described in detail with reference to the accompanying drawings.

Figure 1:
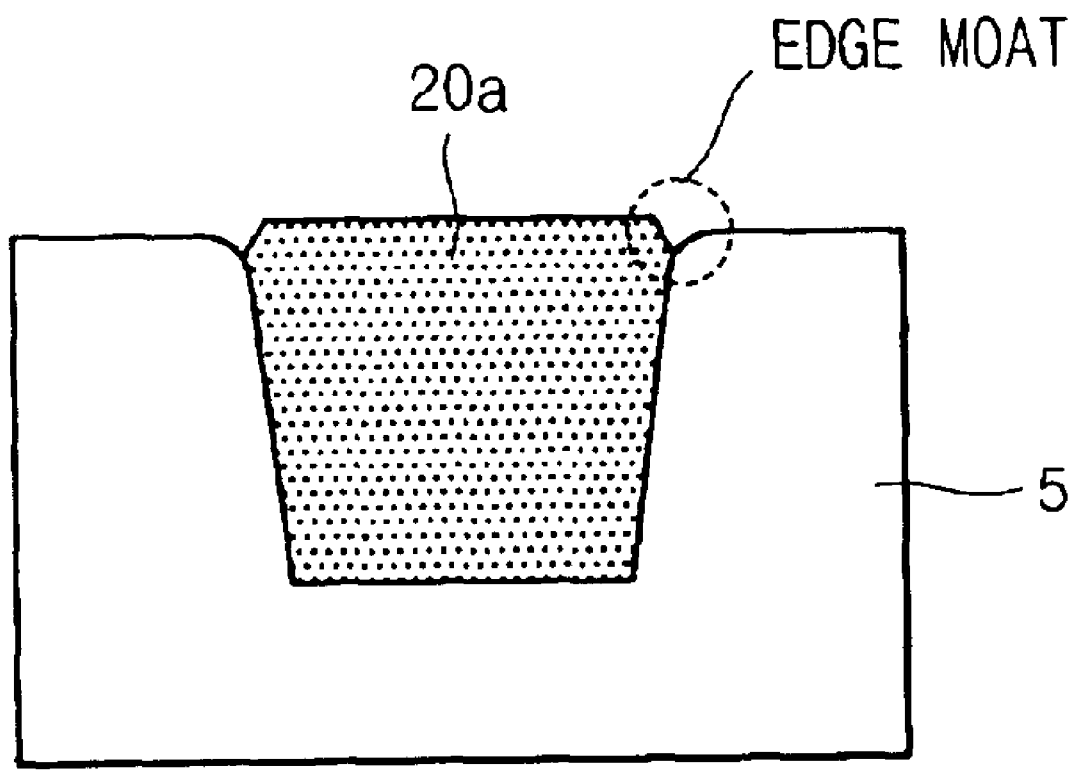
FIG. 1 is a cross-sectional view illustrating a method for forming an isolation film for semiconductor devices according to prior art.
Figure 2A:
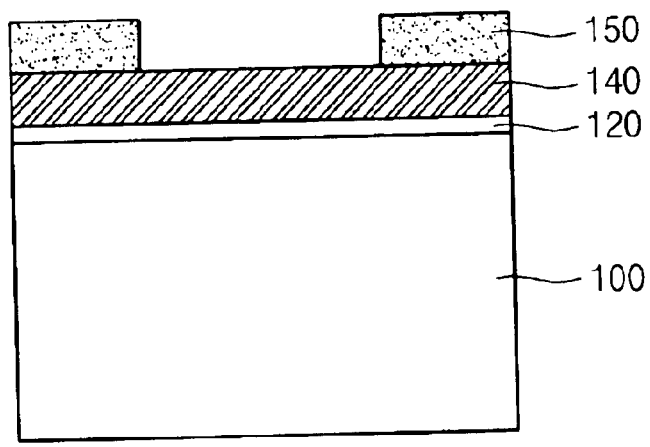
FIGS. 2A to 2J are cross-sectional views illustrating a method for forming an isolation film for semiconductor devices according to the present invention.

As shown in FIG. 2A, a pad oxide film 120, a pad nitride film 140 and a photoresist film are formed on a semiconductor substrate 100, after which the photoresist film is patterned to form a photoresist pattern 150 defining an isolation region.

Figure 2B:
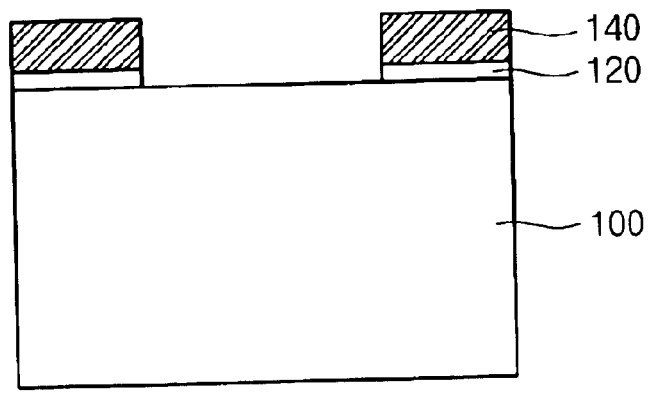

Then, as shown in FIG. 2B, the nitride film 140 and the pad oxide film 120 are dry-etched to expose a portion of the semiconductor substrate 100, which corresponds to the isolation region. In this case, the nitride film 140 and the pad oxide film 120 are dry-etched with an activated plasma of a gas mixture consisting of CHF$_3$, CF$_4$, Ar and O$_2$. Alternatively, the nitride film 140 and the pad oxide film 120 may also be dry-etched with an activated plasma consisting of a gas mixture of CHF$_3$, CF$_4$, Ar, O$_2$ and C$_x$F$_y$.

Figure 2C:
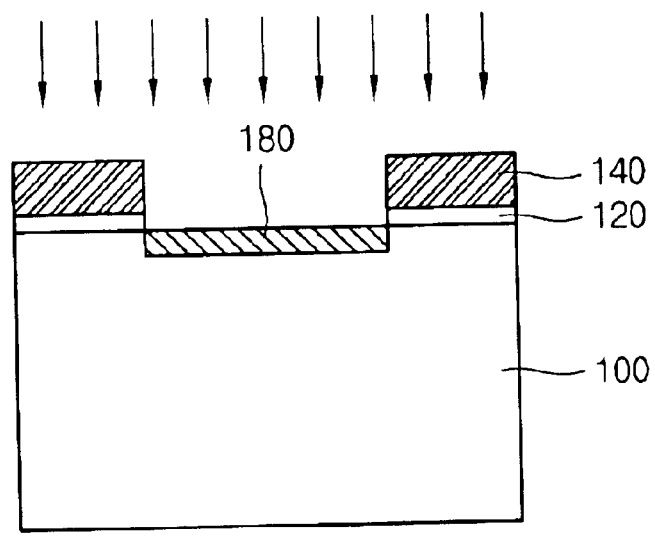

Next, as shown in FIG. 2C, impurity ions are implanted into the exposed portion of the semiconductor substrate 100 to form an impurity ion-implanted layer 180. In this case, pentavalent phosphorus (P) or trivalent boron (B) is preferably used as the impurity ions.

By this implantation of phosphorus (P) or boron (B) ions, the semiconductor substrate 100 has Si—P bonds or Si—B bonds such that the oxidation rate of the substrate in the subsequent oxidation process is more increased. Generally, in an oxidation process, a silicon substrate containing impurity is easily oxidized as compared to a silicon substrate containing no impurity.

Impurity ions, which can be used to accelerate the oxidation of the semiconductor substrate 100, are not limited only to pentavalent phosphorus or trivalent boron.

Figure 2D:
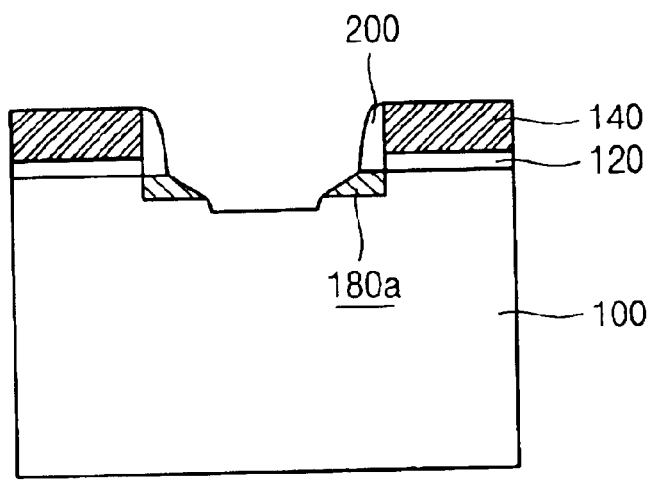

Next, as shown in FIG. 2D, a spacer 200 is formed on a sidewall of the nitride film 140, and at the same time, the ion-implanted layer 180 is dry-etched using the spacer 200 as a mask, thereby forming an ion-implanted residual layer 180a. In this case, the spacer 200 is made of polymer, and the ion-implanted layer 180 is dry-etched with an activated plasma consisting of a gas mixture of $CHF_3$, $CF_4$, Ar and $C_xF_y$. Alternatively, the ion-implanted layer 180 may also be dry-etched with an activated plasma consisting of a gas mixture of $CHF_3$, $CF_4$, Ar, $C_xF_y$, $N_2$ and $H_2$.

As a result of the dry-etching of the ion-implanted layer 180, the ion-implanted residual layer 180a remains below the spacer 200. By the formation of the ion-implanted residual layer 180a, in the subsequent vacuum-hydrogen annealing process, silicon in the ion-implanted residual layer 180a flows at a larger amount than silicon in a portion of the substrate, which was not implanted with impurity ions. This makes a corner of the trench round. This corner rounding becomes an important factor of preventing an edge moat. Hereinafter, the process of dry-etching the ion-implanted layer 180, including forming the spacer 200, is referred to as top corner rounding (TCP) dry etching process.

Although the ion-implanted residual layer 180a may be formed by a single-step TCR dry etching process using the spacer 200 as a mask, this layer 180a is preferably formed by a multi-step TCR dry etching process using a gas containing a given amount of fluorine as a main component. This is because the multi-step TCR dry etching process is more effective in making the trench corner round in the subsequent annealing process.

Hereinafter, the multi-step TCR dry etching process will be described in more detail.

First, polymer is deposited on the sidewall of the nitride film 140 to form a first spacer, and at the same time, a first TCR dry etching step of etching the ion-implanted layer 180 using the first spacer as a mask is carried out. This first TCR dry etching step is carried out using a given flow rate of fluorine (F).

Then, polymer is deposited on the sidewall of the spacer to form a second spacer, and at the same time, a second TCR dry etching step of the ion-implanted layer 180 is carried out. This second TCR dry etching step is carried out using fluorine (F) having an increased flow rate as compared to the first TCR dry etching process.

When the multi-step TCR dry etching process is carried out at gradually increasing flow rates of fluorine as described above, a portion of the semiconductor substrate, which was not masked, is etched to a given thickness together with the ion-implanted layer 180 in a final TCR dry etching step. Thus, the ion-implanted residual layer 180a remaining after dry-etching the ion-implanted layer 180 is slightly rounded.

As described above, in order to increase an efficiency of rounding the trench corner, there can be used a method wherein the flow rate of fluorine is gradually increased as the multi-step TCR dry etching process is progressed. On the contrary, there may also be used a method wherein the flow rate of fluorine is gradually reduced as the multi-step TCR dry etching process is progressed. The latter method attributes to a facet phenomenon.

Although not shown in the drawings, it is understood that, as the multi-step TCR dry etching process is progressed, the thickness of the spacer is gradually increased and the etch rate of the ion-implanted layer 180 at the trench corner is finely controlled, so that an effect of rounding the trench corner is increased.

Figure 2E:
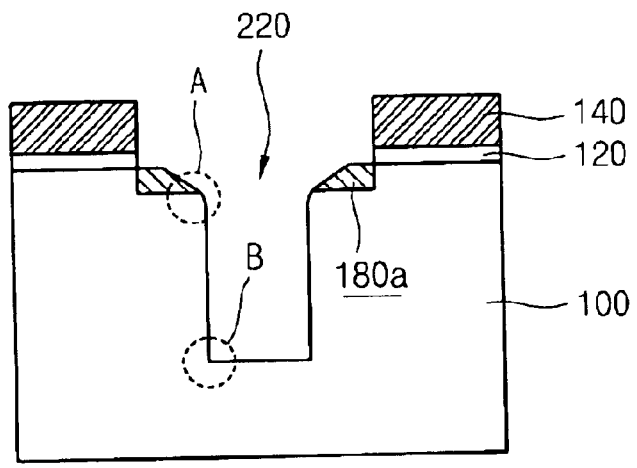
Figure 2E:

Thereafter, as shown in FIG. 2E, the semiconductor substrate 100 is etched to a given depth to form a trench 220. The trench 220 is formed by dry-etching the substrate 100 with an activated plasma consisting of a gas mixture of HBr, $Cl_2$, $O_2$ and $H_2$.

In forming the trench 220, the spacer 200 acts as an etch barrier. Thus, a portion of the ion-implanted layer 180 below the spacer 200, i.e., the ion-implanted residual layer 180a, is not etched, and the surface portion A of the ion-implanted residual layer 180a and the lower corner B of the trench 220 are rounded.

Then, a cleaning process of removing the spacer 200 is carried out. In this cleaning process, a solution containing HF or $H_2SO_4$ is used as a cleaning solution.

Figure 2F:
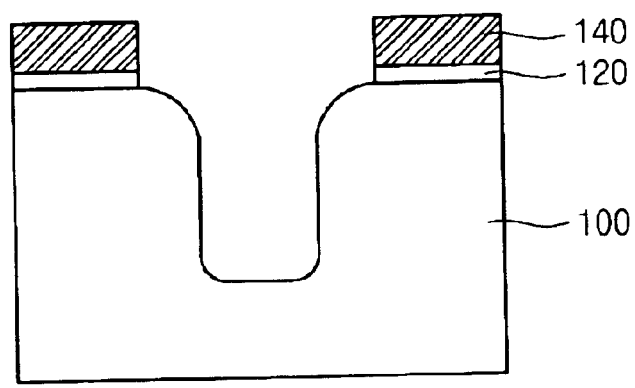

Thereafter, as shown in FIG. 2F, the entire upper surface of the resulting substrate is subjected to a vacuum-hydrogen annealing process at high temperature.

By this vacuum-hydrogen annealing process, silicon (Si) reacts with hydrogen (H), so that the bonding force between silicon atoms is reduced and unstable hydrogen (H)-silicon (Si) bonds are formed. Thus, the substrate has unstable energy conditions where the bonding between hydrogen and silicon is easily cleaved.

By a tendency to convert from unstable energy conditions into stable energy conditions, the flow phenomenon of the upper corner A and the lower corner B of the trench 220 occurs so that the upper corner A and the lower corner B are rounded. Such unstable energy conditions mainly occur at the upper corner A and lower corner B.

Furthermore, the upper corner A having Si—B or Si—P bonds, which corresponds to the surface of the ion-implanted residual layer 180a, is more unstable than a region having Si—Si bonds. Thus, when the vacuum-hydrogen annealing process is carried out, the upper corner A has more unstable energy conditions so that the flow phenomenon more rapidly occurs and the upper corner A of the trench 240 is more effectively rounded. This becomes a critical factor to prevent the formation of an edge moat in the subsequent process.

Figure 2G:
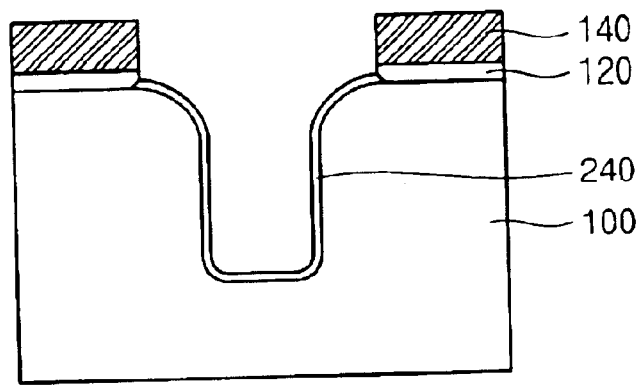

Next, as shown in FIG. 2G, the upper portion of the resulting substrate is subjected to a sacrificial oxidation process to form a sacrificial oxide film 240 within the trench 220. This sacrificial oxide film 240 acts to compensate for the damage of the trench inner wall damaged by the etching process and the vacuum-hydrogen annealing process.

Figure 2H:
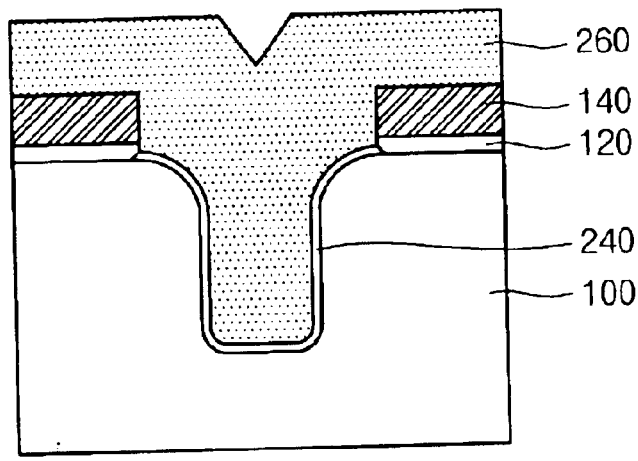

Then, as shown in FIG. 2H, a polarizing oxide film 260 is deposited on the upper portion of the resulting substrate in such a manner that the trench 220 is filled with the polarizing oxide film 260.

Figure 2I:
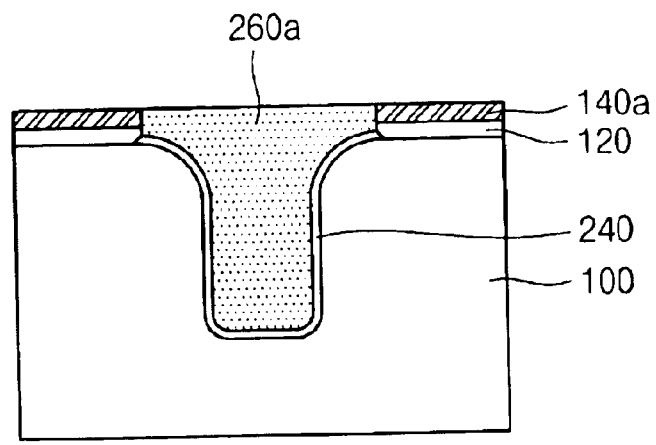

Thereafter, as shown in FIG. 2I, the nitride film 140 and the polarizing oxide film 260 are polarized by a CMP process using the nitride film as a polishing stopper film. Thus, an isolation film 260a and a nitride film 140a are formed.

Figure 2J:
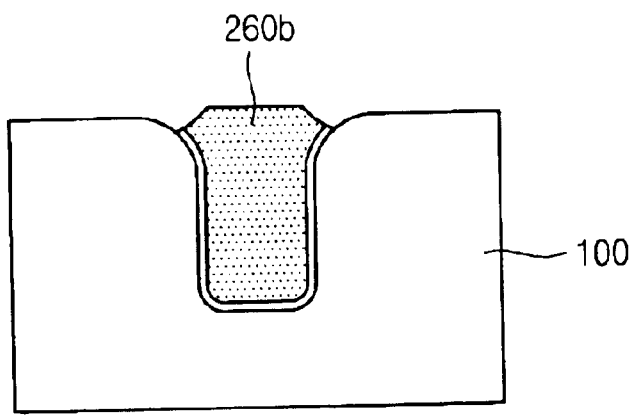

After this, as shown in FIG. 2J, the remaining pad oxide 120 and the remaining nitride film 140a are removed by phosphoric acid dipping, so that an isolation film 260a is formed within the trench along the rounded portion A of the trench corner.

Then, in order to remove foreign substances remaining on the surface of the silicon substrate, the silicon substrate is subjected to a HF cleaning process before deposition of a gate oxide film. In this cleaning process, even if the loss of the isolation film 260a occurs, a final isolation film 260b having no edge moat region can be obtained.

As described above, according to the present invention, the corner of the trench is rounded and the isolation film is formed along the rounded corner. Thus, the formation of an edge moat caused by the cleaning process is prevented to improve device characteristics, such as Hump, INWE and the like, thereby securing the reliability of devices.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for forming an isolation film for semiconductor devices, which comprises the steps of:

successively forming a first oxide film and a nitride film on a semiconductor substrate;

patterning the nitride film and the first oxide film to expose a portion of the semiconductor substrate, which corresponds to an isolation region;

implanting impurity ions into the exposed portion of the semiconductor substrate to form an impurity ion-implanted layer;

forming a spacer at the sidewall of the patterned nitride film, and at the same time, etching the ion-implanted layer using the spacer as a mask;

etching a portion of the semiconductor substrate exposed by the etching of the ion-implanted layer using a gas containing fluorine as a main component for etching, using the spacer as a mask, thereby forming a trench;

removing the spacer;

annealing the trench so that the corner of the trench is rounded;

forming a second oxide film along the inner wall of the trench;

depositing a polarizing oxide film on the entire surface of the resulting substrate in such a manner as to gap fill the trench;

subjecting the polarizing oxide film to chemical mechanical polishing (CMP) using the nitride film as a polishing stopper film, thereby polarizing the polarizing oxide film; and removing the nitride and first nitride films remaining after the polarizing step.

2. The method of claim 1, wherein the step of patterning the nitride film and the first oxide film is carried out by dry-etching with an activated plasma consisting of a gas mixture of $CHF_3$, $CF_4$, Ar and $O_2$.

3. The method of claim 1, wherein the step of patterning the nitride film and the first oxide film is carried out by dry-etching with an activated plasma consisting of a gas mixture of $CHF_3$, $CF_4$, Ar, $O_2$ and $C_xF_y$.

4. The method of claim 1, wherein the impurity ions are phosphorus or boron ions.

5. The method of claim 1, wherein the spacer is made of polymer.

6. The method of claim 1, wherein the etching of the ion-implanted layer provides an ion-implanted residual layer, which is formed by a multi-step dry etching process using the spacer as a mask.

7. The method of claim 6, wherein the surface of the ion-implanted residual layer is rounded.

8. The method of claim 6, wherein the flow rate of fluorine is gradually increased as the multi-step dry etching process is progressed.

9. The method of claim 6, wherein the flow rate of fluorine is gradually reduced as the multi-step dry etching process is progressed.

10. The method of claim 1, wherein the step of etching the ion-implanted layer is carried out by dry etching with an activated plasma consisting of a gas mixture of $CHF_3$, $CF_4$, Ar and $O_2$.

11. The method of claim 1, wherein the step of etching the ion-implanted layer is carried out by dry etching with an activated plasma consisting of a gas mixture of $CHF_3$, $CF_4$, Ar, $C_xF_y$, $N_2$ and $H_2$.

12. The method of claim 1, wherein the step of forming the trench is carried out by dry-etching the substrate with an activated plasma consisting of a gas mixture of HBr, $Cl_2$, $O_2$ and $H_2$.

13. The method of claim 1, wherein the step of removing the spacer is carried out with a cleaning solution containing HF or $H_2SO_4$.

14. The method of claim 1, wherein the second oxide film is a sacrificial oxide film acting to compensate for the damage of the trench inner wall.

15. The method of claim 1, wherein the remaining nitride film is removed by phosphoric acid dipping.

16. The method of claim 1, wherein the isolation film is formed along the rounded corner of the trench.

* * * * *